US009240240B2

(12) United States Patent
Roohparvar et al.

(10) Patent No.: US 9,240,240 B2
(45) Date of Patent: Jan. 19, 2016

(54) APPARATUS HAVING INDICATIONS OF MEMORY CELL DENSITY AND METHODS OF THEIR DETERMINATION AND USE

(75) Inventors: Frankie F. Roohparvar, Monte Sereno, CA (US); Vishal Sarin, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 639 days.

(21) Appl. No.: 13/306,227

(22) Filed: Nov. 29, 2011

(65) Prior Publication Data
US 2013/0135926 A1 May 30, 2013

(51) Int. Cl.
*G11C 11/34* (2006.01)
*G11C 16/10* (2006.01)
*G11C 16/34* (2006.01)

(52) U.S. Cl.
CPC ............ *G11C 16/10* (2013.01); *G11C 16/3404* (2013.01); *G11C 16/349* (2013.01)

(58) Field of Classification Search
CPC ......... G11C 16/107; G11C 8/12; G11C 11/12
USPC ........................ 365/185.03, 200, 201, 185.18
See application file for complete search history.

(56) References Cited

U.S. PATENT DOCUMENTS

| 6,558,967 | B1 | 5/2003 | Wong |
| 6,587,372 | B2 | 7/2003 | Blodgett |
| 8,015,346 | B2 * | 9/2011 | Chen et al. ..................... 711/103 |
| 2005/0232012 | A1 * | 10/2005 | Park ......................... 365/185.17 |
| 2007/0285980 | A1 * | 12/2007 | Shimizu et al. .......... 365/185.03 |
| 2008/0043527 | A1 | 2/2008 | Aritome |
| 2008/0316819 | A1 * | 12/2008 | Lee .......................... 365/185.03 |
| 2009/0027970 | A1 | 1/2009 | Roohparvar et al. |
| 2009/0100244 | A1 * | 4/2009 | Chang et al. ................... 711/172 |
| 2009/0109745 | A1 | 4/2009 | Aritome |
| 2009/0109746 | A1 | 4/2009 | Aritome |
| 2009/0327591 | A1 * | 12/2009 | Moshayedi ......... G06F 11/1441 711/103 |
| 2010/0110788 | A1 | 5/2010 | Bauer |

* cited by examiner

*Primary Examiner* — Han Yang
(74) *Attorney, Agent, or Firm* — Dicke, Billig & Czaja, PLLC

(57) ABSTRACT

Methods and apparatus utilizing indications of memory cell density facilitate management of memory density of a memory device. By permitting each of a plurality of portions of a memory array of the memory device to be assigned a corresponding memory cell density determined through an evaluation of those portions of the memory array, better performing portions of the memory array may not be hindered by lesser performing portions of the memory array.

45 Claims, 8 Drawing Sheets

US 9,240,240 B2

APPARATUS HAVING INDICATIONS OF MEMORY CELL DENSITY AND METHODS OF THEIR DETERMINATION AND USE

TECHNICAL FIELD

The present disclosure relates generally to memory and, in particular, in one or more embodiments, the present disclosure relates to apparatus having indications of memory cell density and methods of their determination and use.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the memory cells, through programming (which is often referred to as writing) of charge storage structures (e.g., floating gates or charge traps) or other physical phenomena (e.g., phase change or polarization), determine the data value of each cell. Common uses for flash memory include personal computers, personal digital assistants (PDAs), digital cameras, digital media players, cellular telephones, solid state drives and removable memory modules, and the uses are growing.

There is a continuing desire to increase memory density, e.g., the number of bits of data that can be stored for a given integrated circuit die area. A variety of approaches can be used, such as reducing the size of individual memory cells, forming memory cells vertically (such as changing the orientation of the memory cells or forming memory cells on multiple planes), or increasing the possible number of data states to which each memory cell can be programmed.

For the reasons stated above, and for other reasons stated below which will become apparent to those skilled in the art upon reading and understanding the present specification, there is a need in the art for alternative methods of determining, assigning and/or using memory density, and devices to perform such methods.

DETAILED DESCRIPTION

Figure 1:
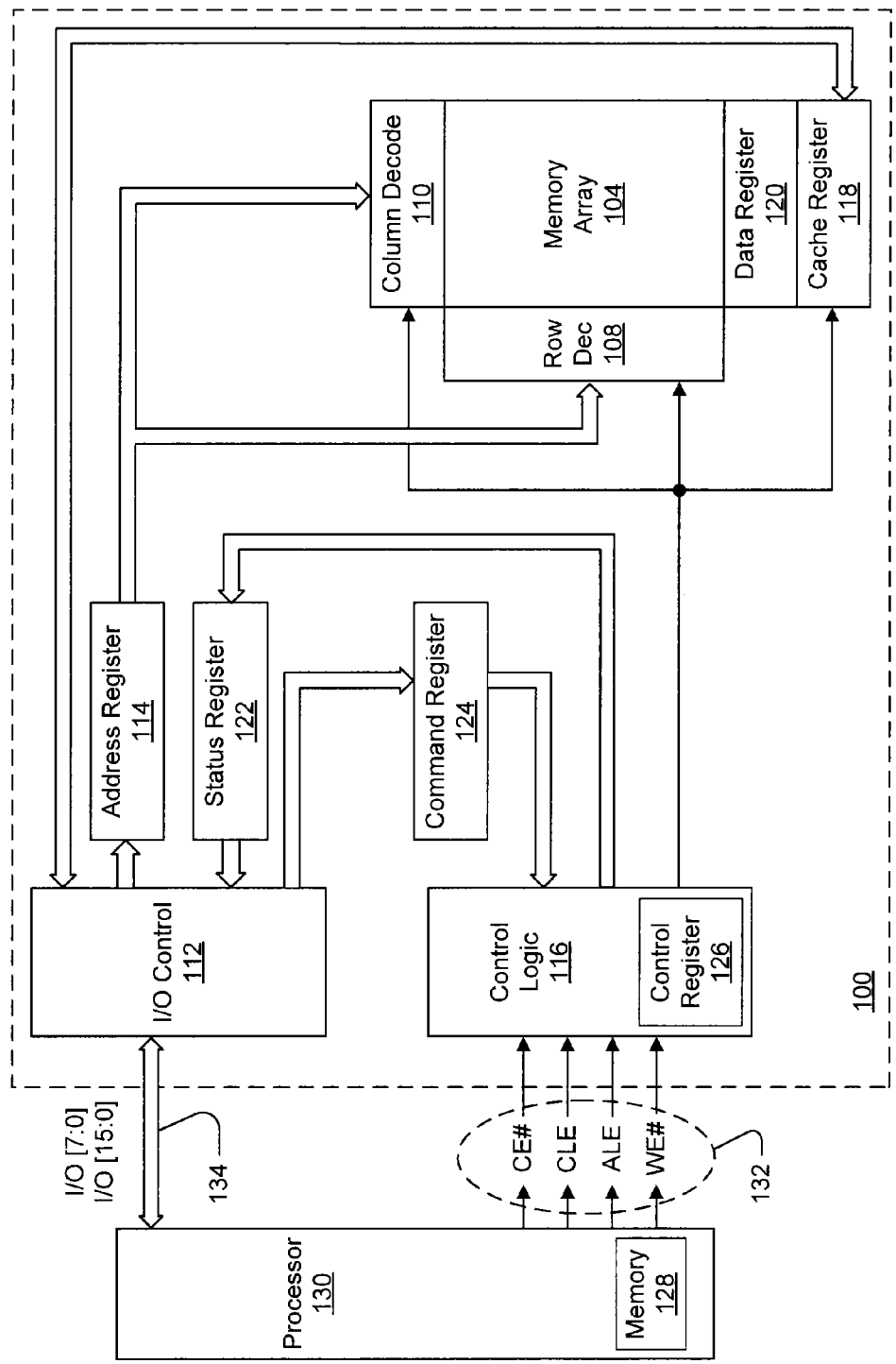
FIG. 1 is a simplified block diagram of a memory device in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Memory cells (e.g., flash memory cells) can be configured as what are known in the art as Single Level Memory Cells (SLC) or Multilevel Memory Cells (MLC). SLC and MLC memory cells assign a data state (e.g., as represented by one or more bits) to a specific range of threshold voltages (Vt) that can be stored on the memory cells. Single level memory cells (SLC) permit the storage of a single binary digit (e.g., bit) of data on each memory cell. Meanwhile, MLC technology permits the storage of more than one binary digit per cell, depending on the quantity of Vt ranges assigned to the cell and the stability of the assigned Vt ranges during the lifetime operation of the memory cell. The number of Vt ranges (e.g., levels), used to represent a bit pattern comprised of N-bits is $2^N$, where N is an integer. For example, one bit may be represented by two ranges, two bits by four ranges, three bits by eight ranges, etc. MLC memory cells may store even or odd numbers of bits on each memory cell.

MLC schemes providing for fractional bits per memory cell are also known. Where a memory cell can be programmed to one of a non-binary number of data states, groupings of memory cells can be used to effectively store more data than would be possible if treating each memory cell as a solitary binary device. For example, if memory cells could be programmed to one of three different data states, a grouping of two memory cells could theoretically be programmed to one of nine ($3^2$) data states. Thus, translating back to a binary system, these two memory cells could collectively be mapped to three bits of data ($2^3$ possible data states), or 1.5 bits per memory cell, leaving one spare (e.g., unused) data state for the grouping of memory cells ($3^2-2^3$). While this is a simple example, the logic for the use of fractional bit storage is well understood and often involves use of binary groupings of memory cells (e.g., 2, 4, 8, 16, 32, 64, etc.) and the use of a binary number of the possible data states. However, while generally more complex, mappings of non-binary groupings of memory cells (e.g., groupings of six memory cells) and the use of the spare data states for the groupings of memory cells (i.e., those possible data states in excess of a binary number of possible data states) are also known. For some further examples, a grouping of 16 memory cells each having the capability to be programmed to one of 10 data states could represent 53 bits of data or 3.31 bits per memory cell, a grouping of 32 memory cells each having the capability to be programmed to one of 12 data states could represent 114 bits of data or 3.56 bits per memory cell, and a grouping of 64 memory cells each having the capability to be programmed to one of 14 data states could represent 243 bits of data or 3.80 bits per memory cell.

The memory density of a memory device has been generally been determined during characterization of the device. Characterization may include the process of determining the read window budget for the memory cells, e.g., how many Vt ranges can be reliably differentiated, for a particular set of reliability criteria. In general, to determine the read window budget, data can be written to the memory cells, and the extent of disturb mechanisms (e.g., the coupling effect of neighboring or subsequently programmed memory cells, interference from neighboring signal lines, physical differences of memory cells, etc.) can be evaluated by reading the memory cells. In response, appropriate widths of Vt ranges (e.g., the range of voltages of the Vt distributions of memory cells programmed to each data state) for each data state and margins between Vt ranges (e.g., the voltage range between adjacent Vt ranges assigned to data states) can be determined (e.g., empirically) to allow satisfying a particular set of reliability criteria. Reliability criteria can include, for example, programming (i.e., writing) and reading data values for a particular number of program/erase cycles, obtaining a particular period of data retention, and maintaining a particular error rate. For example, a memory device might be rated to perform for 3,000 program/erase cycles, have a period of data retention of 10 years, and have an uncorrectable bit error rate of less than one sector per $10^{15}$ bits read. Other criteria might also be considered. For example, a temperature range in which the memory device is intended to operate, a number of hours of service, a supply voltage the memory device is intended to receive, etc. might also affect reliability.

The same memory device might have a different memory density assigned for differing sets of reliability criteria. As one example, for a device intended to have a particular data retention and to accurately perform for 50,000 program/erase cycles, it might be determined to have a read window budget allowing its memory cells to only be programmed to one of two data states (1 bit/cell). That same device, if the set of reliability criteria were to instead require only 3,000 program/erase cycles, might be determined to have a read window budget allowing the memory cells of the device to be programmed to one of four data states (2 bits/cell). To continue this example, the same memory device might allow its memory cells to be programmed to one of eight data states (3 bits/cell) if the program/erase cycles were reduced to 500, and to one of fourteen data states (3.8 bits/cell) if the program/erase cycles were reduced to 150. As such, it can be seen that the same memory device might be assigned different memory densities depending upon the particular reliability that device is intended to exhibit. The number of possible data states to which a memory cell can be programmed will be indicative of memory cell density herein. Thus, if a number of possible data states to which a memory cell can be programmed is two, it will have a memory density of two data states per memory cell (e.g., 1 bit/cell); if a number of possible data states to which a memory cell can be programmed is three, it will have a memory density of three data states per memory cell (e.g., 1.5 bits/cell for a grouping of 2 memory cells); if a number of possible data states to which a memory cell can be programmed is fourteen, it will have a memory density of fourteen data states per memory cell (e.g., 3.80 bits/cell for a grouping of 64 memory cells); etc. As will be apparent, increasing levels of memory cell density will facilitate increasing memory density for a given memory device.

Typically, the assigned memory density of a memory device is limited by the lesser performing portions of its array of memory cells. For example, increasing memory cell density may lead to increasing numbers of blocks being deemed defective, i.e., these blocks, while perhaps capable of storing data accurately using fewer data states per memory cell or for a shorter retention period, are deemed not capable of storing data accurately at the desired memory cell density for the selected set of reliability criteria. As such, to satisfy a particular set of reliability criteria, the memory device may be assigned a lower memory cell density, and thus a lower memory density, in view of the lesser performing portions of its array of memory cells. Various embodiments described herein seek to manage (e.g., increase) the memory density of a memory device by enabling the assignment of memory cell density in response to characterization of individual portions of the array of memory cells. By assigning memory cell density for portions of the array of memory cells in response to their own characterization rather than in response to the characterization of lesser performing portions, increases in memory density can be facilitated.

FIG. 1 is a simplified block diagram of a first apparatus in the form of a memory device 100 in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130 may be a memory controller or other external host device. The processor 130 may include a memory 128 to store indications of memory cell density for portions of the array of memory cells 104. For example, indications of memory cell density may be used in mapping data to the memory device 100 and in performing address translation between a logical address received by the processor 130 and a physical address of the memory device 100 where data is stored for that logical address. Because the memory device 100 can operate different portions of the array of memory cells 104 at different memory cell densities, data associated with a range of logical addresses may occupy different numbers of memory cells depending upon which portion of the array of memory cells 104 is selected to receive that data. For certain embodiments, the indications of memory cell density stored in the memory device 100 indicate the array of memory cells 104 to have three or more different memory cell densities.

It is noted that while the indications of memory cell density could directly include both the number of data states to which each memory cell of the corresponding portion can be programmed and a number of memory cells to be used for each grouping of memory cells with the corresponding portion (e.g., a "grouping size") for mapping data, the indications of memory cell density could indirectly refer to this information. For example, a memory device 100 might be configured to operate at one of thirteen different memory cell densities, e.g., from two to fourteen data states per memory cell. These different memory cell densities could be represented by a 4-bit register value (with three values undefined). The algorithms for operating the memory device 100 at each of the different memory cell densities might presume a specific memory cell grouping for each memory cell density. For example, for two data states per memory cell, its algorithms might presume memory cell groupings of one memory cell; for three data states per memory cell, its algorithms might presume memory cell groupings of two memory cells; for four data states per memory cell, its algorithms might presume memory cell groupings of one memory cell; for five data states per memory cell, its algorithms might presume memory cell groupings of sixteen memory cells; and so on. In such a situation, this 4-bit register would be sufficient to indicate both a memory cell density and a grouping size. Other embodiments might map both memory cell density information and grouping size information to a representative value to permit selection of differing memory cell groupings for a given memory cell density. For certain embodiments, each portion of the array of memory cells contains an integer number of groupings of memory cells for its determined memory cell density.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

Control logic 116 controls access to the array of memory cells 104 in response to the commands and generates status information for the external processor 130. The control logic 116 is in communication with row decode circuitry 108 and column decode circuitry 110 to control the row decode circuitry 108 and column decode circuitry 110 in response to the addresses. The control logic 116 includes a control register 126. Control register 126 stores indications of memory cell density for portions of the array of memory cells 104 in accordance with various embodiments. Alternatively, or in addition, the indications of memory cell density for portions of the array of memory cells 104 may be stored in the array of memory cells 104 itself.

The indications of memory cell density may be used during write operations to the array of memory cells 104. For example, as noted previously, prior memory devices might be characterized and assigned a particular memory cell density. Because this characterization is not performed until after fabrication of the memory device, such memory devices have been configured to operate at one of a plurality of memory cell densities, and each memory cell density may correspond to a different algorithm for writing data to the array of memory cells. Various embodiments described herein can take advantage of the configuration to operate one of a number of different memory cell densities by storing the indications of memory cell density for various portions of the array of memory cells 104, and selecting the appropriate algorithm for writing data to each portion of the array of memory cells 104 in response to its indication. Similar use of different algorithms may apply also to the reading of data from the portions of the array of memory cells 104.

Control logic 116 is also in communication with a cache register 118. Cache register 118 latches data, either incoming or outgoing, as directed by control logic 116 to temporarily store data while the array of memory cells 104 is busy writing or reading, respectively, other data. During a write operation, data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For, another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
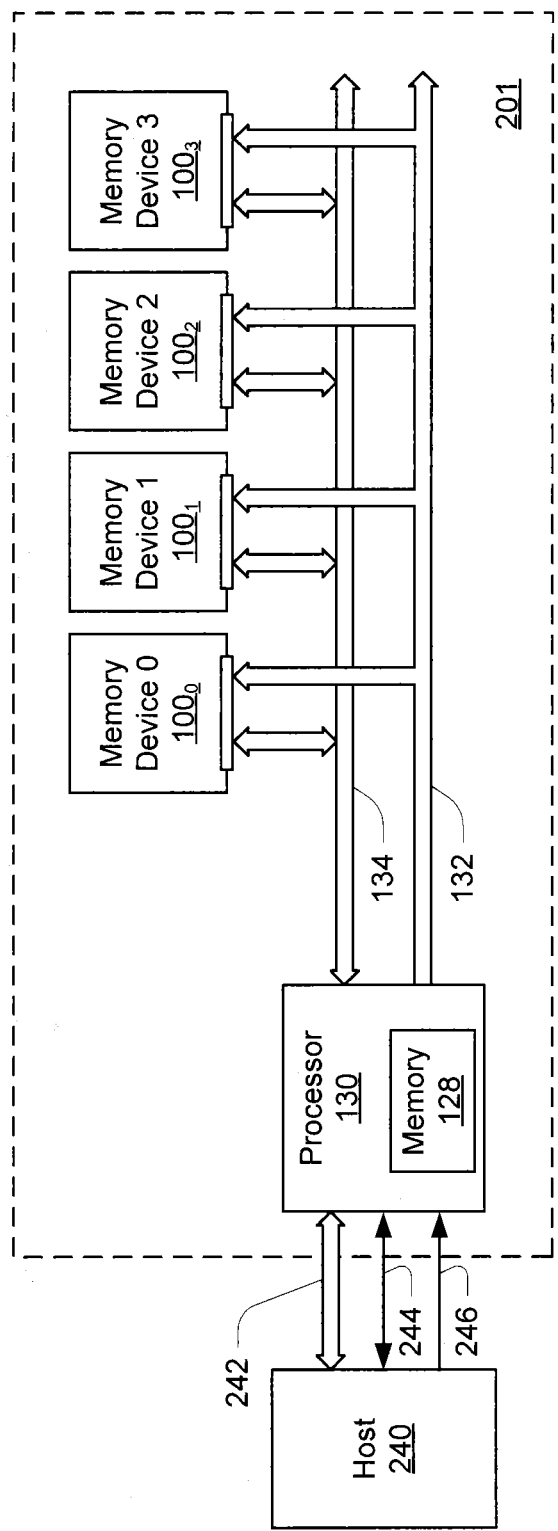
FIG. 2 is a simplified block diagram of a memory module in communication with a host as part of an electronic system, according to another embodiment.

A given processor 130 may be in communication with one or more memory devices 100. FIG. 2 is a simplified block diagram of an apparatus in the form of a memory module 201 in communication with a host 240 as part of an electronic system, according to another embodiment. Memory devices 100, processor 130 and memory 128 may be as described with reference to FIG. 1. Although memory module 201 is depicted with four memory devices 100, memory module could have one or more memory devices 100, and may include one or more other memory devices (not shown in FIG. 2) that are not configured to perform methods of various embodiments described herein.

Because processor 130 (e.g., a memory controller) is between the host 240 and the memory devices 100, communication between the host 240 and the processor 130 may involve different communication links than those used between the processor 130 and the memory devices 100. For example, the memory module 201 may be an Embedded MultiMediaCard (eMMC) of a solid state drive (SSD). In accordance with existing standards, communication with an eMMC may include a data link 242 for transfer of data (e.g., an 8-bit link), a command link 244 for transfer of commands and device initialization, and a clock link 246 providing a clock signal for synchronizing the transfers on the data link 242 and command link 244. The processor 130 may handle many activities autonomously, such as error correction, management of defective blocks, wear leveling and address translation. As such, the host 240 may be unaware that memory devices 100 have varying levels of memory cell density.

Figure 3A:
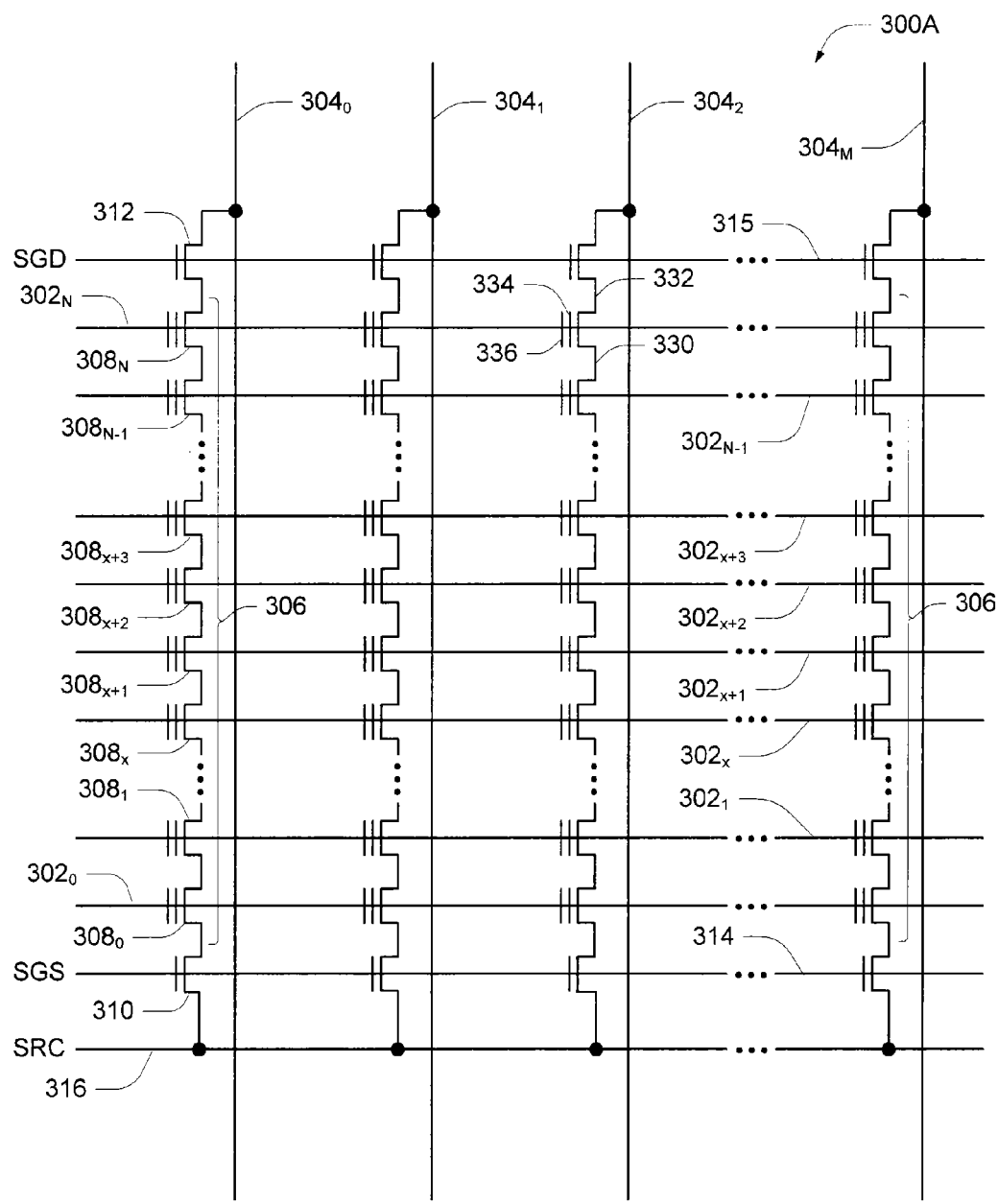
FIGS. 3A-3C are schematics of portions of an array of memory cells as could be used in a memory device of the type described with reference to FIG. 1.

FIG. 3A is a schematic of an array of memory cells 300A, e.g., as a portion of the array of memory cells 104, in accordance with an embodiment. Array of memory cells 300A includes access lines, such as word lines $302_0$ to $302_N$, and intersecting data lines, such as bit lines $304_0$ to $304_M$. For ease of addressing in the digital environment, the number of word lines 302 and the number of bit lines 304 are generally each some power of two, e.g., 256 word lines 302 by 4,096 bit lines 304.

Array of memory cells 300A is arranged in rows (each corresponding to a word line 302) and columns (each corresponding to a bit line 304). Each column may include a string of memory cells 308, such as one of the NAND strings 306. Each NAND string 306 may be coupled to a common source line (SRC) 316 and includes memory cells $308_0$ to $308_N$, each located at an intersection of a word line 302 and a bit line 304. The memory cells 308, depicted as floating-gate transistors in FIG. 3A, represent non-volatile memory cells for storage of data. The memory cells 308 of each NAND string 306 are connected in series, source to drain, between a source select line (SGS) 314 and a drain select line (SGD) 315.

Source select line 314 includes a source select gate 310, e.g., a field-effect transistor (FET), at each intersection between a NAND string 306 and source select line 314, and drain select line 315 includes a drain select gate 312, e.g., a field-effect transistor (FET), at each intersection between a NAND string 306 and drain select line 315. In this way, the memory cells 308 of each NAND string 306 are connected between a source select gate 310 and a drain select gate 312. Arrays of memory cells utilizing more than one select gate at one or both ends of a NAND string 306 are known. If multiple source select gates 310 are utilized for a given string of memory cells 306, they could be coupled in series between the common source line 316 and the memory cell $308_0$ of that string of memory cells 306. If multiple drain select gates 312 are utilized for a given string of memory cells 306, they could be coupled in series between the corresponding bit line 304 and the memory cell $308_N$ of that string of memory cells 306.

A source of each source select gate 310 is connected to common source line 316. The drain of each source select gate 310 is connected to the source of the memory cell 308 of a corresponding NAND string 306. Therefore, each source select gate 310 selectively couples its corresponding NAND string 306 to common source line 316. A control gate of each source select gate 310 is connected to source select line 314.

The drain of each drain select gate 312 is connected to the bit line 304 for the corresponding NAND string 306. The source of each drain select gate 312 is connected to the drain of the last memory cell $308_N$ of its corresponding NAND string 306. Therefore, each drain select gate 312 selectively couples a corresponding NAND string 306 to a corresponding bit line 304. A control gate of each drain select gate 312 is connected to drain select line 315.

Typical construction of memory cells 308 includes a source 330 and a drain 332, a data-storage structure 334 (e.g., a floating gate, charge trap, etc.) that can determines a data value of the cell (e.g., through changes in threshold voltage), and a control gate 336, as shown in FIG. 3A. Memory cells 308 have their control gates 336 coupled to (and in some cases from) a word line 302. A column of the memory cells 308 is a NAND string 306 or a plurality of NAND strings 306 coupled to a given bit line 304. A row of the memory cells 308 are memory cells 308 commonly coupled to a given word line 302. A row of memory cells 308 can, but need not include all memory cells 308 commonly coupled to a given word line 302. Rows of memory cells 308 often include every other memory cell 308 commonly coupled to a given word line 302. For example, memory cells 308 commonly coupled to word line $302_N$ and selectively coupled to even bit lines 304 (e.g., bit lines $304_0$, $304_2$, $304_4$, etc.) may be one row of memory cells 308 (e.g., even memory cells) while memory cells 308 commonly coupled to word line $302_N$ and selectively coupled to odd bit lines 304 (e.g., bit lines $304_1$, $304_3$, $304_5$, etc.) may be another row of memory cells 308 (e.g., odd memory cells). Although bit lines $304_3$-$304_5$ are not expressly depicted in FIG. 3A, it is apparent from the figure that the bit lines 304 of the array of memory cells 300A may be numbered consecutively from bit line $304_0$ to bit line $304_M$. Other groupings of memory cells 308 commonly coupled to a given word line 302 may also define a row of memory cells 308. For certain memory devices, all memory cells commonly coupled to a given word line might be deemed a physical row, while those portions of the physical row that are read during a single read operation (e.g., even or odd memory cells) might be deemed a logical row.

Figure 3B:
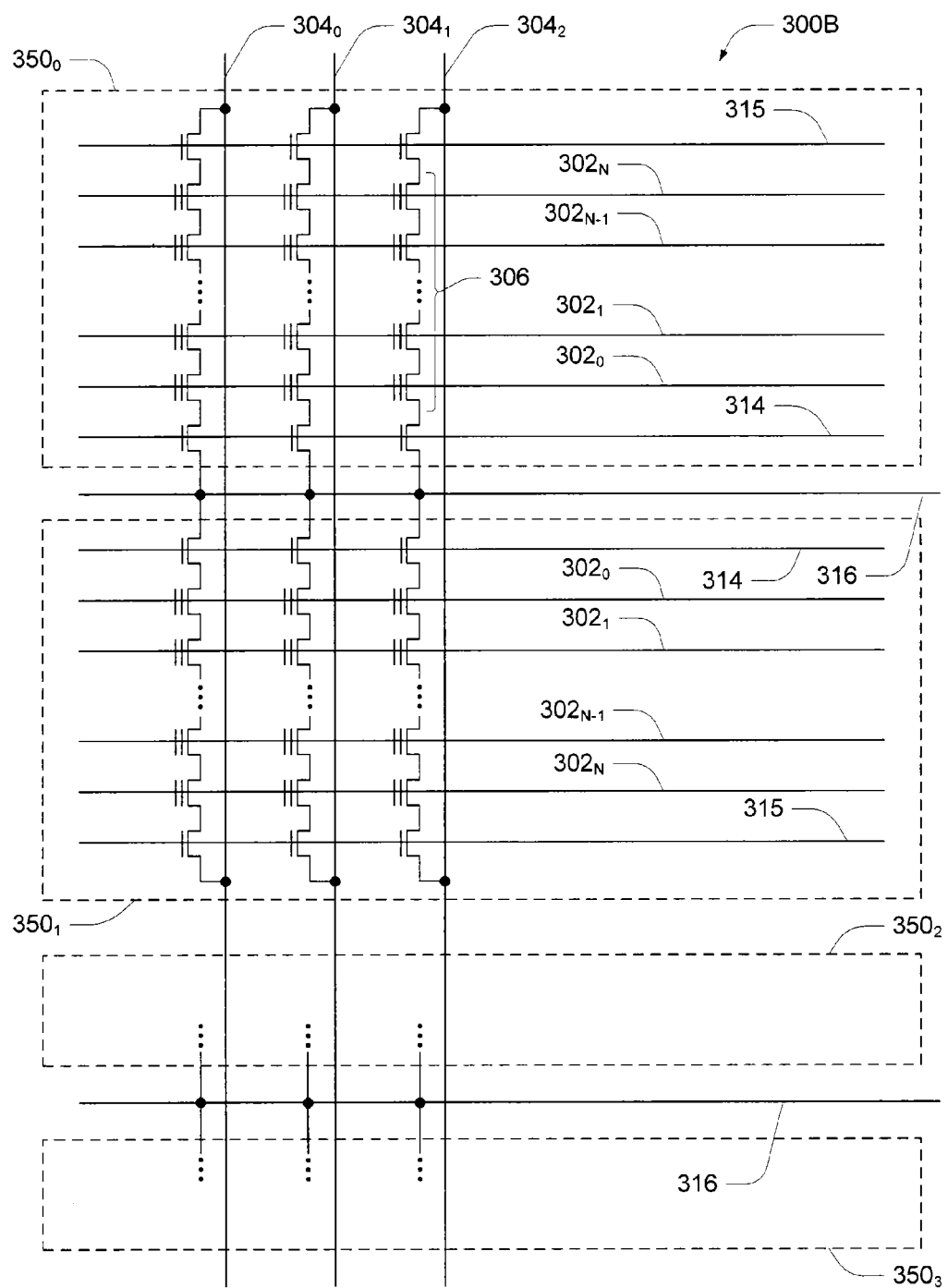

FIG. 3B is a schematic of an array of memory cells 300B, e.g., as a portion of the array of memory cells 104, in accordance with another embodiment. Array of memory cells 300B may include NAND strings 306, word lines 302, bit lines 304, source select lines 314, drain select lines 315 and source lines 316 as depicted in FIG. 3A. The array of memory cells 300A may be a portion of the array of memory cells 300B, for example. FIG. 3B depicts groupings of NAND strings 306 into blocks 350. Blocks 350 may be erase blocks, e.g., groupings of memory cells 308 that may be erased together in a single erase operation.

Figure 3C:
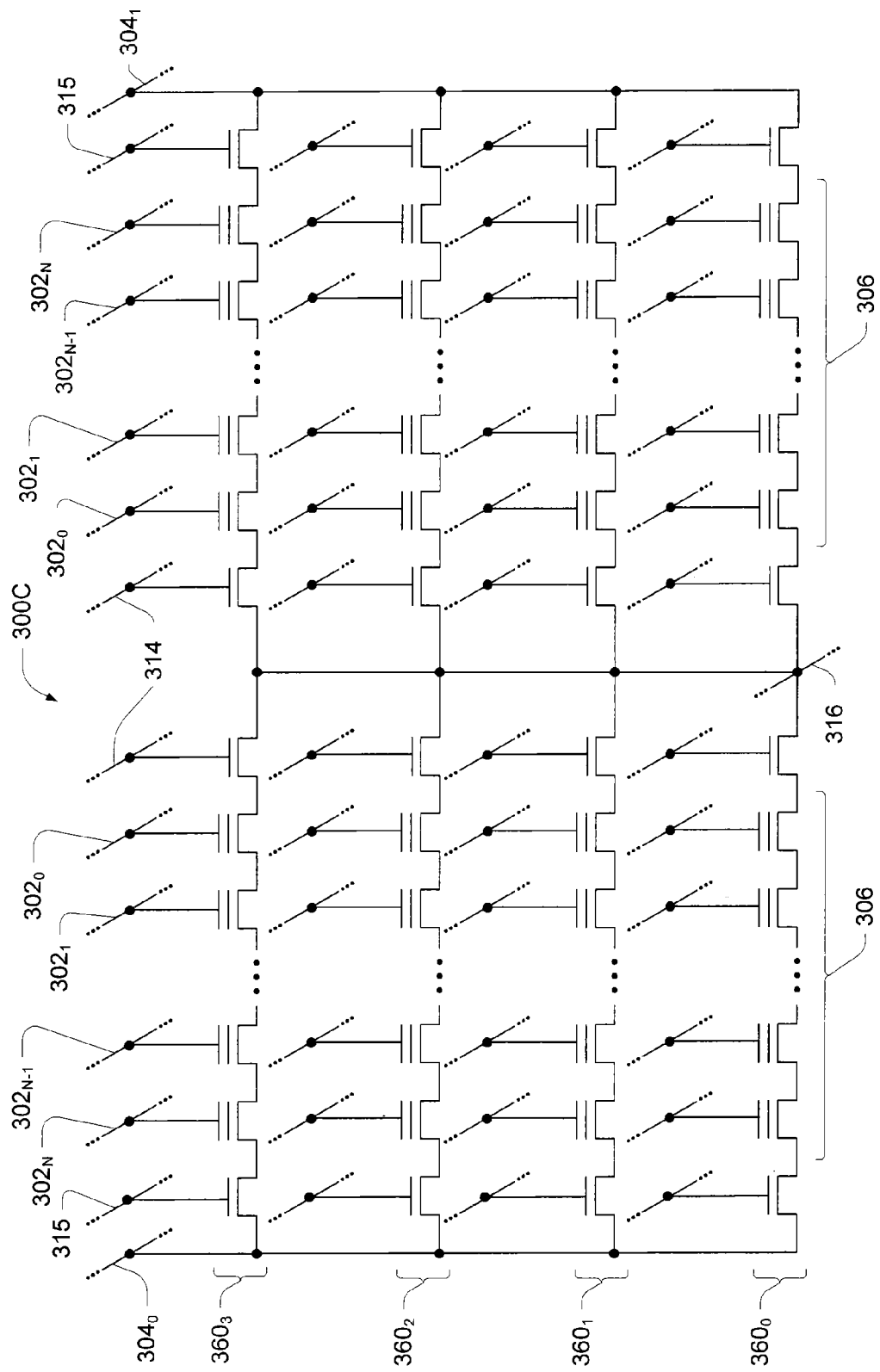

FIG. 3C is a schematic of an array of memory cells 300C, e.g., as a portion of the array of memory cells 104, in accordance with another embodiment. Array of memory cells 300C may include NAND strings 306, word lines 302, bit lines 304, source select lines 314, drain select lines 315 and source lines 316 as depicted in FIG. 3A. The array of memory cells 300A may be a portion of the array of memory cells 300C, for example. FIG. 3C depicts groupings of NAND strings 306 formed on various planes 360, i.e., a multi-plane array of memory cells.

Although the examples of FIGS. 3A-3C were discussed in conjunction with NAND architecture memory, the embodiments described herein are not limited to NAND architecture memory. As such, the array of memory cells 104 can include other memory architectures, such as NOR architecture, AND architecture, etc.

While certain portions of an array of memory cells may contain entire series-connected strings of memory cells, e.g., where those portions include erase blocks or planes, other portions of the array of memory cells may span less than all of the memory cells of a particular series-connected string of memory cells, e.g., where those portions include physical or logical rows of memory cells. For example, memory cells in one portion of a series-connected string of memory cells may be suitable for different memory cell densities than memory cells of other portions of the string due to differing disturb mechanisms. To further this example, and with reference to FIG. 3A, memory cells $308_0$ and $308_N$ next to the select gates 310 and 312, respectively, may be suitable to operate at one memory cell density while remaining memory cells $308_1$-$308_{N-1}$ may be suitable to operate at a higher memory cell density. As such, one indication of memory cell density may correspond to memory cells $308_0$ and $308_N$, and another indication of memory cell density may correspond to memory cells $308_1$-$308_{N-1}$. Indications of memory cell density may correspond to different or additional portions of a series-connected string of memory cells. For further embodiments, each memory cell of a series-connected string of memory cells corresponds to one of the indications of memory cell density, e.g., the particular series-connected string of memory cells may span a number of portions of the array of memory cells equal to a number of memory cells of the particular series-connected string of memory cells. The indications of memory cell density may be independent of other indications of memory cell density, i.e., a particular indication of memory cell density for one portion of the array of memory cells may be determined or stored separately from an indication of memory cell density of another portion of the array of memory cells.

Figure 4:
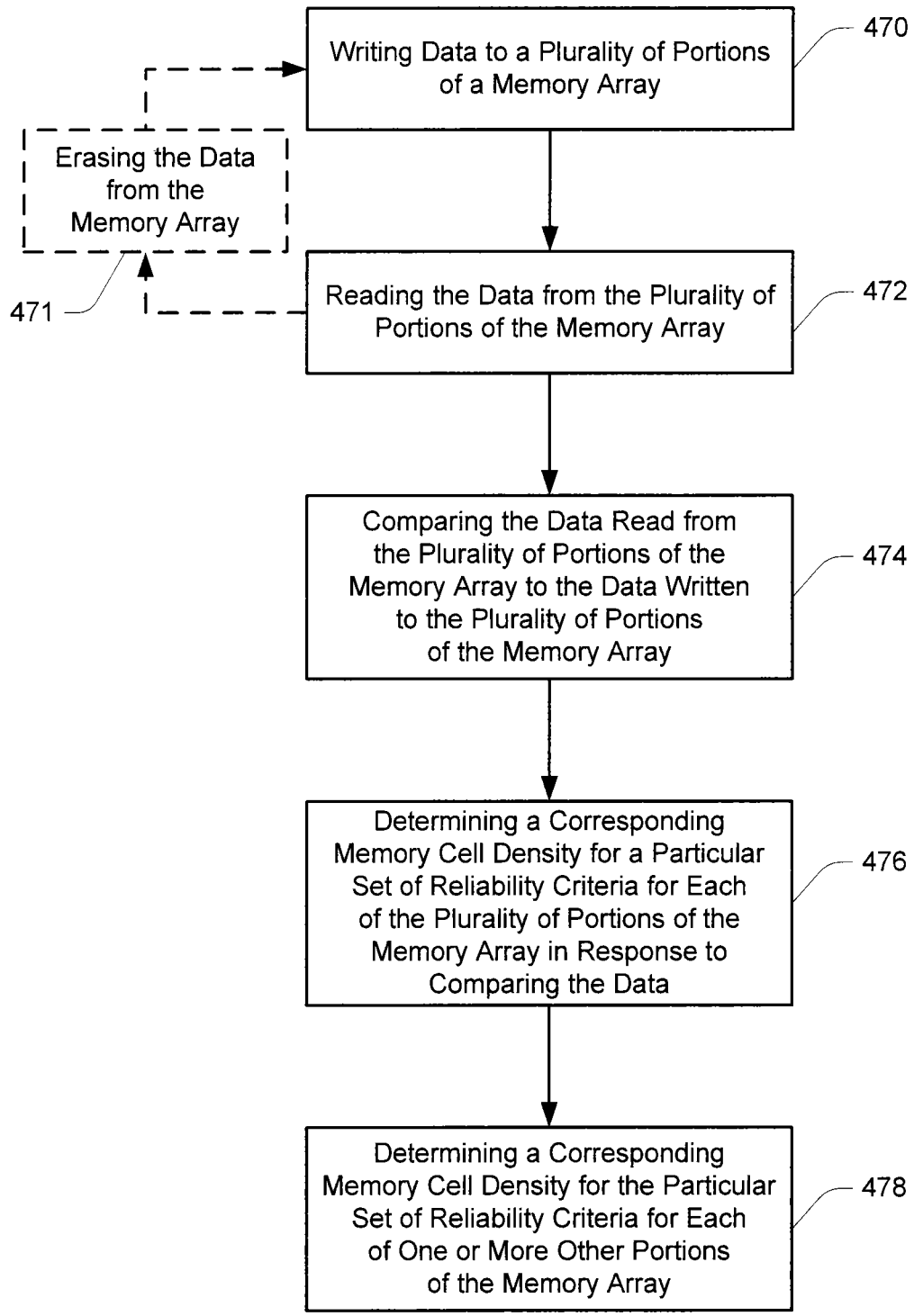
FIG. 4 is a flowchart of a method of operating a memory device in accordance with an embodiment.

FIG. 4 is a flowchart of a method of operating a memory device in accordance with an embodiment. The method of FIG. 4 might be performed by the fabricator of the memory device as part of standard testing, for example. Alternatively or in addition, a processor of a memory module might be configured to perform the method periodically, e.g., after a particular number of program/erase cycles; or after a particular number of portions of the memory device have been marked as defective; or in response to a user command. At 470, data is written to a plurality of portions of an array of memory cells. The data is some known set of data. The data may be pseudo-randomly generated. Alternatively, the data may be a particular pattern of data intended to evaluate specific disturb mechanisms for characterizing the array of memory cells. For certain embodiments, the plurality of portions are less than all portions of the array of memory cells, e.g., the plurality of portions of an array of memory cells might be a subset of all planes of a multi-plane array of memory cells, a subset of all erase blocks of an array of memory cells, a subset of all physical rows of an array of memory cells, a subset of all logical rows of an array of memory cells, etc. For example, the plurality of portions of an array of memory cells might include portions of the array of memory cells (e.g., a particular set of groupings of memory cells including planes, erase blocks, physical rows, logical rows, or some combination thereof) expected to be representative of the performance of other portions of the array of memory cells. At 472, the data is read from the plurality of portions of the array of memory cells. This sequence of writing data and reading data may be repeated for some number of times to evaluate differing disturb mechanisms (e.g., through writing of different data for subsequent iterations). An intervening erasing of the data from the array of memory cells may occur at 471. However, useful information may be obtained by merely writing a new data state (i.e., a higher Vt) to the memory cell without erasing the previous data.

At 474, the data read from the plurality of portions of the array of memory cells are compared to the data written to the plurality of portions of the array of memory cells. Comparing the data may include determining a $\Delta Vt$ between the data written and the data read, determining a range of Vt for a particular data state written to a portion of the array of memory cells, determining a margin between ranges of Vt for adjacent data states written to the portion of the array of memory cells, etc. At 476, a corresponding memory cell density for a particular set of reliability criteria is determined for each of the plurality of portions of the array of memory cells in response to comparing the data. As noted previously, algorithms for determining memory cell density in response to reading and writing data to an array of memory cells are known.

At 478, for embodiments where the plurality of portions of the array of memory cells are less than all portions of the array of memory cells, a corresponding memory cell density for the particular set of reliability criteria is determined for each of one or more other portions of the array of memory cells. Determining memory cell density for these other portions may be in response to an expectation that these other portions will perform similar to one or more of the plurality of portions for which a data comparison was performed, such that they could be assigned the same memory cell density.

For a specific example, each plane of a multi-plane memory device might be expected to perform at a similar level. In this instance, the plurality of portions of the array of memory cells might include all or a subset of memory cells of one of the planes. With reference to FIG. 3C, this might include all of the memory cells coupled to word lines $302_0$-$302_N$ of NAND strings 306 of plane $360_0$ selectively coupled to bit line $304_0$ as it might be expected that memory cells coupled to word line $302_0$ of NAND strings 306 of plane $360_0$ selectively coupled to bit line $304_1$ would perform at a similar level as memory cells coupled to word line $302_0$ of NAND strings 306 of plane $360_0$ selectively coupled to bit line $304_0$; memory cells coupled to word line $302_1$ of NAND strings 306 selectively coupled to bit line $304_1$ would perform at a similar level as memory cells coupled to word line $302_1$ of NAND strings 306 of plane $360_0$ selectively coupled to bit line $304_0$; and so on. As such, memory cells coupled to word lines $302_0$-$302_N$ of NAND strings 306 of planes $360_1$-$306_3$ selectively coupled to bit lines $304_0$ and $304_1$, and memory cells coupled to word lines $302_0$-$302_N$ of NAND strings 306 of planes $360_0$ selectively coupled to bit line $304_1$ would not need to be written to and read from in order to determine a memory cell density, thereby saving time during the characterization of the memory device. As a further example, erase blocks having similar characteristics might be deemed to perform at a similar level, allowing them to be assigned the same memory density. With reference to FIG. 3B, erase blocks $350_0$ and $350_1$ commonly coupled to the same source line 316 might be expected to perform at similar levels, while erase blocks $350_2$ and $350_3$ commonly coupled to the same source line 316 might be expected to perform at similar levels. As such, writing and reading of memory cells of these erase blocks could be reduced to only one erase block per pair. In addition, writing and reading of memory cells for these erase blocks might involve only a portion of each of these erase blocks, e.g., where some physical or logical rows are expected to perform similar to other physical or logical rows in these erase blocks.

In addition, the determination of memory cell density for the one of the other portions of the array of memory cells at 478 could include a function of the memory cell density for one of the plurality of portions of the array of memory cells other than an identity function. For a specific example, where a physical row of memory cells includes two or more logical rows of memory cells, one of the logical rows of memory cells might be expected to perform differently than one of the other logical rows, but in an expected manner. With reference to the discussion of FIG. 3A, if even memory cells 308 commonly coupled to a given word line 302 are programmed before odd memory cells 308 commonly coupled to the given word line 302, these odd memory cells 308 might be expected to have an increased level of disturb, and thus be suitable for a lesser memory cell density than the corresponding even memory cells 308. As such, after determining a memory cell density for the even memory cells 308 (e.g., a logical row of memory cells), the memory cell density for the odd memory cells 308 (e.g., a logical row of memory cells) may be determined as a function of the memory cell density for the even memory cells 308. Such a function may be determined empirically from historical memory cell density data for similar types of memory devices to establish an expectation of the difference in performance. While the foregoing example determined a lesser memory cell density as a function of a higher memory cell density, the reverse would also be applicable with an appropriate change in the function (i.e., if y≈f(x) then x≈f' (y)).

Figure 5:
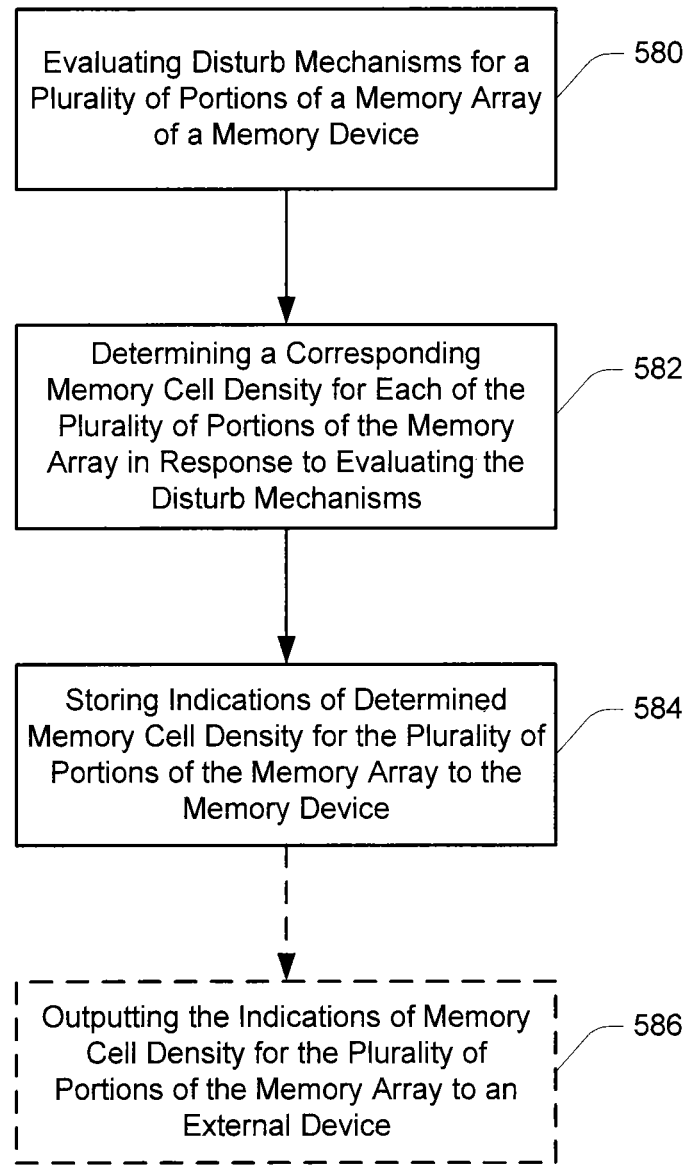
FIG. 5 is a flowchart of a method of operating a memory device in accordance with another embodiment.

FIG. 5 is a flowchart of a method of operating a memory device in accordance with another embodiment. The method of FIG. 5 might be performed by the fabricator of the memory device as part of standard testing, for example. Alternatively or in addition, a processor of a memory module might be configured to perform the method periodically, e.g., after a particular number of program/erase cycles; or after a particular number of portions of the memory device have been marked as defective; or in response to a user command. At 580, disturb mechanisms are evaluated for a plurality of portions of an array of memory cells of a memory device. At 582, a corresponding memory cell density is determined for each of the plurality of portions of the array of memory cells in response to evaluating the disturb mechanisms. For certain embodiments, the memory cell density is individually determined for each logical row of memory cells, each physical row of memory cells, each erase block of memory cells, and/or each plane of memory cells. For certain embodiments, the determined memory cell densities vary within a series-connected string of memory cells. For certain further embodiments, the determined memory cell densities include three or more values.

The memory cell density might be determined to satisfy a particular set of reliability criteria. For example, the memory cell density might be determined as described with reference to FIG. 4. The memory cell density might be determined for each portion of the array of memory cells through writing and reading of data. Alternatively, memory cell densities might be determined for a plurality of portions of the array of memory cells that is less than all portions of the array of memory cells through writing and reading of data, and memory cell density for one or more other portions of the array might be determined as a function of memory cell density of portions of the plurality of portions of the array of memory cells. At 584, indications of the determined memory cell density for the plurality of portions of the array of memory cells are stored. The indications might be stored to a control register of the memory device, for example. For certain embodiments, the indications might be stored to the array of memory cells itself. For further embodiments, the indications might be stored to the array of memory cells itself, and these indications might be read from the array of memory cells and written to a control register of the memory device as part of an initialization process of the memory device for use by control logic of the memory device during write operations and/or read operations. Indications of determined memory cell density might be stored in a one-to-one correspondence for each portion of the array of memory cells. Alternatively, the stored indications might correspond to more than one portion of the array of memory cells, e.g., to a range of addresses of the array of memory cells. Once the indications of memory cell density have been stored to the memory device, these indications are available for use by an external device, e.g., a processor. Thus, for further embodiments, at 586, the indications of memory cell density for the plurality of portions of the array of memory cells may be output to the external device, such as in response to an initialization of the memory device or in response to a query from the external device. For example, a processor to control access to the memory device, e.g., a memory controller, could be configured to obtain the indications of memory cell density from the memory device, e.g., by querying the memory device for the indications or by responding to the initialization of the memory device, for use in mapping data to the memory device and/or in performing address translation.

Figure 6:
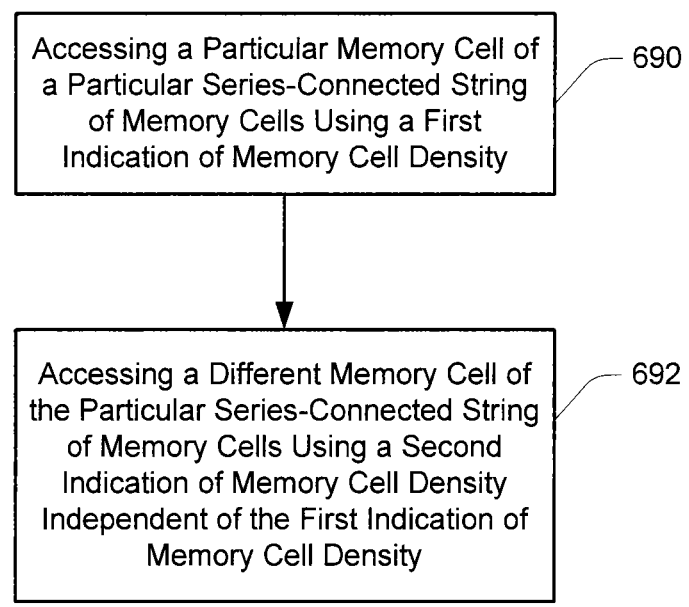
FIG. 6 is a flowchart of a method of operating a memory device in accordance with another embodiment.

FIG. 6 is a flowchart of a method of operating a memory device in accordance with another embodiment. At 690, a particular memory cell of a particular series-connected string of memory cells is accessed using a first indication of memory cell density corresponding to the particular memory cell. At 692, a different memory cell of the particular series-connected string of memory cells is accessed using a second indication of memory cell density corresponding to the different memory cell. The first indication of memory cell density may have the same value as the second indication of memory cell density, or it may have a different value. However, the first indication of memory cell density and the second indication of memory cell density are independent values. For example, the first indication of memory cell density may correspond to memory cells of one or more physical or logical rows of memory cells, while the second indication of memory cell density may correspond to memory cells of one or more other physical or logical rows of memory cells, with each indication corresponding to a portion of the array of memory cells spanning one or more memory cells of the particular series-connected string of memory cells.

CONCLUSION

Methods and devices utilizing indications of memory cell density facilitate management of memory density of a memory device. By permitting each of a plurality of portions of a memory array of the memory device to be individually assigned a memory cell density determined through an evaluation of those portions of the memory array, better performing portions of the memory array may not be hindered by lesser performing portions of the memory array.

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:
1. An apparatus, comprising:
an array of memory cells comprising a plurality of series-connected strings of memory cells; and
a control logic to control access to the array of memory cells;
wherein indications of memory cell density for a plurality of portions of the array of memory cells are stored in the apparatus;
wherein two or more indications of memory cell density correspond to a particular series-connected string of memory cells of the plurality of series-connected strings of memory cells; and
wherein each indication of memory cell density corresponding to the particular series-connected string of memory cells corresponds to a different respective set of memory cells of the particular series-connected string of memory cells.

2. The apparatus of claim 1, wherein each memory cell of the particular series-connected string of memory cells corresponds to a corresponding one of the indications of memory cell density.

3. The apparatus of claim 1, wherein each of the indications of memory cell density corresponding to the particular series-connected string of memory cells is independent of other of the indications of memory cell density corresponding to the particular series-connected string of memory cells.

4. The apparatus of claim 1, wherein the indications of memory cell density are stored in a location selected from the array of memory cells and a control register of the control logic.

5. The apparatus of claim 1, wherein the indications of memory cell density are stored in the array of memory cells, and wherein the control logic is further configured to read the indications of memory cell density from the array of memory cells as part of an initialization process of the apparatus.

6. The apparatus of claim 1, wherein the indications of memory cell density comprise three or more different values.

7. The apparatus of claim 1, wherein a number of the indications of memory cell density is equal to a number of the plurality of portions of the array of memory cells.

8. The apparatus of claim 1, wherein at least one of the indications of memory cell density corresponds to more than one of the portions of the array of memory cells.

9. The apparatus of claim 1, wherein each of the indications of memory cell density represents both a number of data states to which each memory cell of the corresponding portion of memory cells can be programmed and a number of memory cells to be used for each grouping of memory cells for mapping of data to the corresponding portion of the plurality of portions of the memory array.

10. The apparatus of claim 1, wherein each portion of the plurality of portions of the array of memory cells is selected from the group consisting of a plane of the array of memory cells, an erase block of the array of memory cells, a physical row of the array of memory cells, a logical row of the array of memory cells, or some combination thereof.

11. The apparatus of claim 1, wherein the control logic is further configured to select an algorithm for writing data to a particular portion of the array of memory cells in response to the indication of memory cell density for that particular portion of the array of memory cells.

12. An apparatus, comprising:
an array of memory cells comprising a plurality of series-connected strings of memory cells; and
a control logic to control access to a particular memory cell of a particular series-connected string of memory cells of the plurality of series-connected strings of memory cells using a first indication of memory cell density corresponding to the particular memory cell and to control access to a different memory cell of the particular series-connected string of memory cells using a second indication of memory cell density corresponding to the different memory cell;
wherein the first indication of memory cell density is independent of the second indication of memory cell density.

13. The apparatus of claim 12, wherein each memory cell of the particular series-connected string of memory cells corresponds to a corresponding indication of memory cell density that is independent of an indication of memory cell density corresponding to any other memory cell of the particular series-connected sting of memory cells.

14. The apparatus of claim 12, wherein at least one of the first indication of memory cell density and the second indication of memory cell density corresponds to a memory cell in more than one string of series-connected strings of memory cells of the plurality of strings of memory cells.

15. The apparatus of claim 14, wherein the first indication of memory cell density and the second indication of memory cell density correspond, respectively, to a first logical row of memory cells of the array of memory cells and a second logical row of memory cells of the array of memory cells.

16. The apparatus of claim 12, wherein access comprises an operation selected from the group consisting of reading data and writing data.

17. An apparatus, comprising:
a memory device comprising an array of memory cells and storing indications of memory cell density for a plurality of portions of the array of memory cells; and
a processor to control access to the memory device, wherein the processor is configured to obtain the indications of memory cell density from the memory device;
wherein the array of memory cells comprises a plurality of series-connected strings of memory cells; and
wherein two or more indications of memory cell density correspond to a particular series-connected string of memory cells of the plurality of series-connected strings of memory cells; and
wherein each indication of memory cell density corresponding to the particular series-connected string of memory cells corresponds to a different respective set of memory cells of the particular series-connected string of memory cells.

18. The apparatus of claim 17, wherein the processor is configured to obtain the indications of memory cell density as part of an initialization process of the memory device.

19. The apparatus of claim 17, wherein the processor is configured to obtain the indications of memory cell density by querying the memory device.

20. The apparatus of claim 17, wherein the particular series-connected string of memory cells spans two or more of the portions of the array of memory cells.

21. The apparatus of claim 20, wherein the particular series-connected string of memory cells spans a number of the portions of the array of memory cells equal to a number of memory cells of the particular series-connected string of memory cells.

22. The apparatus of claim 17, wherein the indications of memory cell density for the plurality of portions of the array of memory cells comprise indications having at least three different values.

23. The apparatus of claim 17, wherein the processor is further configured to determine a corresponding memory cell density for each of the plurality of portions of the array of memory cells.

24. The apparatus of claim 23, wherein the processor is further configured to determine the corresponding memory cell density for each of the plurality of portions of the array of memory cells to satisfy a particular set of reliability criteria.

25. The apparatus of claim 24, wherein the particular set of reliability criteria comprises programming and reading data values for a particular number of program/erase cycles, obtaining a particular period of data retention, maintaining a particular error rate, operating at a particular temperature range, operating for a particular number of hours, and receiving a particular supply voltage.

26. The apparatus of claim 23, wherein the processor is further configured to determine the corresponding memory cell density for the particular set of reliability criteria for each of the plurality of portions of the array of memory cells for at least one condition selected from the group consisting of periodically, in response to a particular number of portions of the memory device being marked as defective, and in response to a user command.

27. The apparatus of claim 23, wherein the processor is further configured to determine a corresponding memory cell density for the particular set of reliability criteria for one or more other portions of the array of memory cells as a function of memory cell density for one or more of the plurality of portions of the array of memory cells.

28. A method of operating a memory device, comprising:
evaluating disturb mechanisms for a plurality of portions of an array of memory cells of the memory device;
determining a corresponding memory cell density for each of the plurality of portions of the array of memory cells in response to evaluating the disturb mechanisms; and
storing indications of the determined memory cell densities for each of the plurality of portions of the array of memory cells to the memory device.

29. The method of claim 28, wherein determining a corresponding memory cell density for each of a plurality of portions of an array of memory cells comprises determining the corresponding memory cell density for a particular set of reliability criteria for each of the plurality of portions of an array of memory cells.

30. The method of claim 29, wherein evaluating disturb mechanisms for a plurality of portions of an array of memory cells comprises:
writing data to the plurality of portions of the array of memory cells;
reading the data from the plurality of portions of the array of memory cells; and
comparing the data read from the plurality of portions of the array of memory cells to the data written to the plurality of portions of the array of memory cells.

31. The method of claim 28, wherein storing indications of the determined memory cell densities for the plurality of portions of the array of memory cells to the memory device comprises storing information representative of both a number of data states to which each memory cell of a corresponding portion of the array of memory cells can be programmed and a number of memory cells to be used for grouping memory cells for mapping data to the memory device.

32. The method of claim 29, wherein determining the memory cell densities for the particular set of reliability criteria comprises determining the memory cell densities for criteria selected from the group consisting of programming and reading data values for a particular number of program/erase cycles, obtaining a particular period of data retention, maintaining a particular error rate, operating at a particular temperature range, operating for a particular number of hours, and receiving a particular supply voltage.

33. A method of operating an array of memory cells, comprising:
writing data to a plurality of portions of an array of memory cells;
reading the data from the plurality of portions of the array of memory cells;
comparing the data read from the plurality of portions of the array of memory cells to the data written to the plurality of portions of the array of memory cells;
determining a corresponding memory cell density for a particular set of reliability criteria for each of the plurality of portions of the array of memory cells in response to comparing the data; and
determining a corresponding memory cell density for the particular set of reliability criteria for each of one or more other portions of the array of memory cells without comparing data read from the one or more other portions of the array of memory cells to data written to the one or more other portions of the array of memory cells.

34. The method of claim 33, wherein writing data to a plurality of portions of an array of memory cells and reading the data from the plurality of portions of the array of memory cells is repeated for more than one iteration.

35. The method of claim 34, further comprising erasing the data from the plurality of portions of the array of memory cells after reading the data from the plurality of portions of the array of memory cells.

36. The method of claim 34, wherein the data written to the plurality of portions of the array of memory cells is different for a subsequent iteration.

37. The method of claim 33, wherein determining a corresponding memory cell density for the particular set of reliability criteria for each of one or more other portions of the array of memory cells further comprises assigning a corresponding memory cell density to one of the other portions of the array of memory cells as a function of the memory cell density of one of the plurality of portions of the array of memory cells.

38. An apparatus, comprising:
an array of memory cells, wherein:
a first group of memory cells of the array of memory cells are assigned a first memory cell density; and
a second group of memory cells of the array of memory cells are assigned a second memory cell density different from the first memory density,
wherein a memory cell of the first group of memory cells is connected in series with a memory cell of the second group of memory cells.

39. The apparatus of claim 38, wherein the first group of memory cells comprises a first physical row of memory cells and wherein the second group of memory cells comprises a second physical row of memory cells.

40. The apparatus of claim 38, wherein the first group of memory cells comprises a first logical row of memory cells and wherein the second group of memory cells comprises a second logical row of memory cells.

41. The apparatus of claim 38, wherein the first group of memory cells comprises a physical row of memory cells and wherein the second group of memory cells comprises a logical row of memory cells.

42. A method of operating an array of memory cells, comprising:
individually determining memory cell density for each of a plurality of portions of the array of memory cells; and
assigning the corresponding individually determined memory cell density to each of the plurality of portions of the array of memory cells;
wherein a memory cell of a particular portion of the plurality of portions of the array of memory cells is connected in series with a memory cell of a different portion of the plurality of portions of the array of memory cells.

43. A method of operating an array of memory cells, comprising:
storing a corresponding indication of memory cell density for each of a plurality of portions of the array of memory cells; and
operating each of the plurality of portions of the array of memory cells in accordance with its corresponding indication of memory cell density;

wherein a memory cell of one of the plurality of portions of the array of memory cells having a particular corresponding indication of memory cell density is connected in series with a memory cell of another one of the plurality of portions of the array of memory cells having a different corresponding indication of memory cell density.

44. The method of claim 43, wherein the stored indications of memory cell density correspond to the plurality of portions of the array of memory cells in a one-to-one correspondence.

45. The method of claim 43, wherein each of a number of the stored indications of memory cell density correspond to more than one of the plurality of portions of the array of memory cells.

* * * * *